July 25, 1961 A. C. SHECKLER 2,993,340

REFRIGERATION SYSTEM

Filed April 9, 1959

INVENTOR.
ADDISON C. SHECKLER

BY Herman Seid

ATTORNEY

United States Patent Office 2,993,340

Patented July 25, 1961

2,993,340

REFRIGERATION SYSTEM

Addison C. Sheckler, Cato, N.Y., assignor to Carrier Corporation, Syracuse, N.Y., a corporation of Delaware Filed Apr. 9, 1959, Ser. No. 805,219
7 Claims. (Cl. 62—3)

Figure 1:
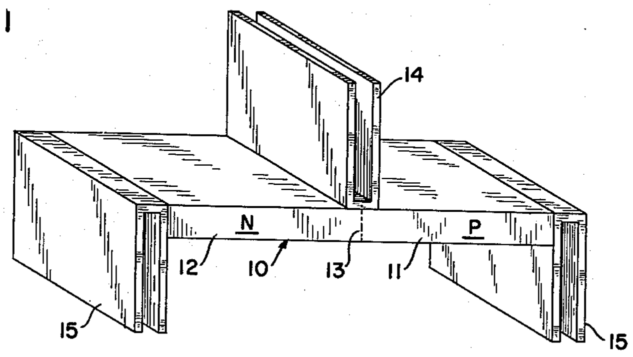

This invention relates to refrigeration, more particularly to a refrigeration system embodying thermoelectric devices and means implementing the facility with which a single crystal thermoelectric couple may be utilized in a heat pumping system.

A variety of thermoelectric couples have been evolved designed to operate in accordance with the Peltier effect to produce heat pumping from the cold junction to the hot junction of coupled thermoelectric arms in a circuit. These thermoelectric couples are conventionally formed of two thermoelectrically dissimilar materials. One of the arms of the couple is formed of a P-type material having positive thermoelectric power, and the other arm is formed of an N-type having negative thermoelectric power. The passage of current through these thermoelectric arms produces a hot junction and a cold junction. In the design of these thermoelectric couples, the geometric configurations of the elements is of great importance, since in order to employ the thermoelectric couple for its heat pumping effects, it is necessary to effectively thermally insulate the cold junction from the hot junction. Since the thermoelectric arms may themselves act as heat conductors the problem is further increased. Other problems are encountered arising from the difficulties of mechanically assembling the different thermoelectric materials along with a junction to attain the desired Peltier effects. A unitary crystal structure containing two thermoelectrically dissimilar materials has greater thermoelectric power than a couple formed of two separate arms. The advantage of a unitary structure is due to the fact that the mobility of the charge carriers is not limited by surface boundaries between the materials. However the junction between the materials has the major portion of its surface area hidden between the arms of the couple, making this surface unavailable for heat transfer.

It is with the above problems in mind, that the present means have been evolved, means providing a thermoelectric couple formed of a unitary crystal structure having a P-N junction with a relatively large effective heat transfer area.

It is accordingly a primary object of this invention to provide an improved thermoelectric couple.

Another object of the invention is to provide a thermoelectric couple for use as a heat pump having a relatively large effective heat transfer surface at the P-N junction and the junction of the current source to the thermoelectric materials.

It is also an object of the invention to provide a unitary crystal thermoelectric couple with an efficient heat transfer junction.

A further object of the invention is to provide an efficient single crystal P-N junction.

An additional object of the invention is to provide a thermoelectric couple having a geometric configuration which will implement the attainment of desired Peltier effects.

It is also an object of the invention to provide a simply fabricated thermoelectric couple which may be economically and efficiently produced.

These and other objects of the invention which will become apparent from the following disclosure and claims are achieved by forming a thermoelectric couple from a single crystal having a P-N junction. The crystal is of a geometric configuration in which the width of the thermoelectric couple is of any feasible size but is in no event less than the thickness, which should be as small as practicably consistent with the heat load the couple is to carry. At the junction between the P-type and N-type materials of the single crystal a fin is secured to extend the effective heat transfer surface of the junction. At the ends of the couple adjacent the connection to the current source, other fins are extended in an opposite direction from the first mentioned fin for a similar purpose. The formation of the couple from a crystalline material having a unitary structure with the P-type and N-type materials integral eliminates the problem of attaining a suitable bond or junction between the P and N interfaces and implements the mobility of the charge carriers between the arms of the couple since there are no surface boundaries between the arms. Thereafter the crystal containing the P-N junction is cut into a shape as above discussed.

An important feature of the invention resides in the formation of a thermoelectric couple in which the P-N junction is integrally formed without engendering any problems of forming a thermoelectric junction, such as the formation of a bond between the conventionally employed junction material and the arms of the couple.

Another feature of the invention resides in the fact that the junction between the P-type material and N-type material of a single crystal structure is provided with an extended heat transfer area, thus permitting the use of a high thermoelectric power single crystal in the forming of couples.

Figure 2:
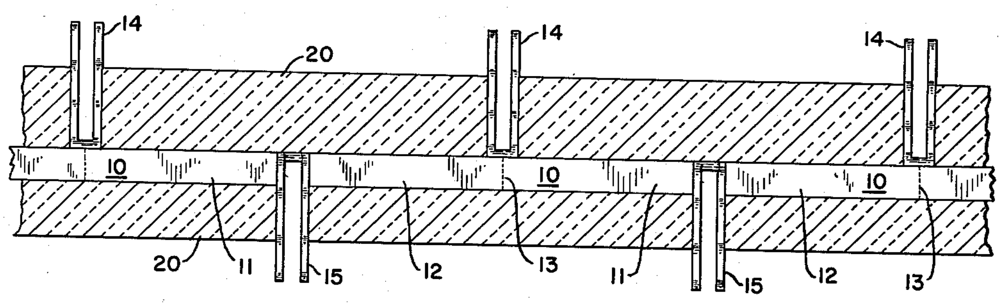

The constructional details of the invention will be made most manifest and particularly pointed out in conjunction with the accompanying drawings, wherein:

FIGURE 1 is a perspective view of a thermoelectric couple constructed in accordance with the teachings of this invention; and FIGURE 2 is a cross sectional view of a battery of couples such as illustrated in FIGURE 1 showing how this couple may be arranged in a practical application.

Referring now more particularly to the drawings, like numerals in the various figures will be taken to designate like parts.

As seen in the drawing, the thermoelectric couple 10 comprises a single thermoelectric element having an arm 11 of P-type material and an arm 12 of N-type material with a P-N junction 13 formed therebetween. Arms 11 and 12 are preferably cut from a unitary crystal structure having P-type material and N-type material integrally with an interface therebetween. It will be apparent that in a single crystal structure this transition between the P-type material and the N-type material will generally be over a transition area rather than a clearly delimited boundary plane.

Thereafter the crystal is cut into the shape illustrated in FIGURE 1. The crystal containing the P-N junctions is cut into flat plates with the plane of the junction perpendicular to the longitudinal axis of the plate. The here referred to longitudinal axis is the axis running through both the P-type material and the N-type material. The width of the plate which is measured perpendicularly to the longitudinal axis (and may in fact be dimensionally larger than the length) is of any desired value, but should not be less than the thickness of the plate. The thickness should be as small as practicable, consistent with the heat load carried by the couple.

A cooling fin 14 in the form of a U-shaped channel is secured to one side of the P-N junction 13 (the upper part as viewed in FIGURES 1 and 2). Similar hot junction fins 15 are secured at the free ends of the P and N arms respectively, adjacent the connection of these arms to an electrical conductor (not shown) coupled to a source of direct current, either a D.C. generator, battery, or rectifier.

Where this structure is utilized in some commercial application, it will obviously be desirable to electrically and thermally insulate the fins and the electrical conductor from each other. To this end an arrangement such as shown in FIGURE 2 is employed in which a battery or pile of couples 10 such as seen in FIGURE 2 are arranged adjacent each other with insulation 20 interposed between the fins. The insulation 20 may be formed of a suitable material such as expanded mica in an epoxy resin or a foamed in place material such as foamed polystyrene or the like.

All the cold junction fins 14 of the couples forming the battery are arranged on one side (upwardly as viewed in the drawing) and all the hot junction fins 15 are arranged on the opposite side of the battery (downwardly as viewed in the drawing).

The aforedescribed structure provides a novel thermoelectric couple 10 formed of a single crystal. The single crystal contains both P-type and N-type material with a transition area between the P-type and N-type material, said transition area forming a P-N junction.

In fabrication of this single crystal, thermoelectric couple, a crystal containing the P-N junction is cut into flat plates with the plane of the junction perpendicular to an axis extending through the P-type and N-type material. As noted, the width of the plate (as measured transversely to the aforementioned axis) can be of any feasible value so long as greater than the thickness of the plate. The thickness should be as small as possible and at the same time adequate to carry the heat load of the couple.

A suggested set of dimensions would be a plate ⅛" thick, 1" wide, and 2" long. The fin 14 which as noted is of a U-shaped configuration having a base portion and leg portion is secured to the plate along the transition area forming the P-N junction. The base portion of the fin in the desired embodiment is preferably of a thickness e.g., length along the axis of the thermoelectric plate, equal to the thickness of the plate, namely ⅛". Similar fins 15 are secured to opposed ends of the plate remote from the P-N junction as shown, in heat exchange relationship with the ends of the couple formed by the plate which are electrically connected to conductors permitting the couple 10 to form part of a D.C. circuit. It will be understood that the fins are made up of a good thermally conducting material such as copper, aluminum or the like.

After formation of the couple as above described, it may be employed to effect heat pumping by directing a D.C. current therethrough. In operation, the fact that the atoms of both the P-type and N-type materials are arranged in the same highly ordered lattice serves to increase the mobility of the charge carriers through the couple thus providing improved thermoelectric properties. With the increased charge carrier mobility, for any given voltage applied across the couple 10, there will be a relatively larger flow of charge carriers, and temperature change, than would be available in a couple in which the charge carriers were less mobile. Whatever defects might arise through the difficulty of effecting heat transfer from the single crystal P-N junction have been mitigated by the particular geometry of the couple, and the provision of the novel fins.

It is thus seen that a novel single crystal thermoelectric couple has been provided having improved charge carrier mobility which improves the thermoelectric properties of the couple. Additionally the novel couple is simple in fabrication, having a minimal number of parts requiring assembly, and requiring a minimal number of electrical bonds to be made.

Though the instant inventive concept has been described as embodied in a single crystal structure, it will be appreciated by those skilled in the art that the same teaching may be employed in conjunction with a thermoelectric element having thermoelectric couple formed of a unitary polycrystal.

The above disclosure has been given by way of illustration and elucidation, and not by way of limitation, and it is desired to protect all embodiments of the herein disclosed inventive concept within the scope of the appended claims.

I claim:

1. In a refrigeration system, a battery of thermoelectric couples, each couple comprising a unitary thermoelectric element of N-type material and P-type material with a P-N junction therebetween, a fin secured to each said element in heat exchange relation with the P-N junction thereof, said unitary elements having an axial length substantially greater than their thickness, the axial length of the base of said fin in contact with the surface of said thermoelectric member being substantially less than the length of said thermoelectric member, an additional fin provided adjacent each of the ends of said element in heat exchange relationship therewith, means to electrically couple opposite ends of said elements remote from said junctions, a plurality of couples being electrically interconnected in a D.C. circuit with the P-type material of one element connected to the N-type material of an adjacent element whereby the combined heat pumping effects of all the elements may be utilized.

2. A refrigeration system as in claim 1 in which said fins provided on the ends extend away from the couple in a direction opposite to the fin at the junction.

3. A refrigeration system as in claim 2 in which said fins are U-shaped; and insulation is provided between adjacent fins.

4. A thermoelectric couple comprising a unitary thermoelectric element having a portion composed of N-type material and axially contiguous portion composed of P-type material forming a junction region therebetween, said element having an axial length substantially greater than its thickness, and a fin having a base secured to the surface of said element adjacent the said junction region, the axial length of the base of said fin in contact with the surface of said thermoelectric element being substantially less than the length of said element and having a leg extending therefrom whereby said fin is adapted for use as a heat transfer member in heat exchange relation with said junction region.

5. A thermoelectric couple as defined in claim 4 further comprising a pair of additional fins having a portion thereof extending away from said thermoelectric couple, said additional fins being located one adjacent each end of said thermoelectric element, said additional fins extending in the opposite direction from said thermoelectric element as said leg.

6. A thermoelectric couple as defined in claim 4 wherein said fin comprises a U-shaped member having a base and a pair of legs extending generally perpendicularly therefrom.

7. A thermoelectric couple as defined in claim 6 further comprising a pair of additional U-shaped fins each having a base and legs extending generally perpendicular thereto, said additional fins being secured one at each end of said thermoelectric element in contact with said end, the legs of said additional fins extending in the opposite direction from said thermoelectric element from the legs of the fin secured adjacent the junction region and insulation means between said fins.

References Cited in the file of this patent

UNITED STATES PATENTS

| | | |
|---|---|---|
| 413,136 | Dewey | Oct. 15, 1889 |
| 1,818,437 | Stuart | Aug. 11, 1931 |
| 2,298,250 | Brown | Oct. 6, 1942 |
| 2,685,608 | Justi | Aug. 3, 1954 |
| 2,749,716 | Lindenblad | June 2, 1956 |
| 2,798,989 | Welker | July 9, 1957 |
| 2,811,569 | Frederick | Oct. 29, 1957 |
| 2,872,788 | Lindenblad | Feb. 10, 1959 |
| 2,886,618 | Goldsmid | May 12, 1959 |
| 2,919,553 | Fritts | Jan. 5, 1960 |